(12) United States Patent
Deas et al.

(10) Patent No.: US 6,480,021 B2
(45) Date of Patent: Nov. 12, 2002

(54) TRANSMITTER CIRCUIT COMPRISING TIMING DESKEWING MEANS

(75) Inventors: Alexander Roger Deas, Edinburgh (GB); Vasily Grigorievich Atyunin, Saint Petersburg (RU); Igor Anatolievich Abrosimov, St. Petersburg (RU)

(73) Assignee: Acuid Corporation Limited, Guernsey (GB)

( * ) Notice: Subject to any disclaimer, the term of this patent is extended or adjusted under 35 U.S.C. 154(b) by 0 days.

(21) Appl. No.: 09/985,726

(22) Filed: Nov. 6, 2001

(65) Prior Publication Data

US 2002/0051506 A1 May 2, 2002

Related U.S. Application Data

(60) Provisional application No. 60/244,179, filed on Oct. 31, 2000, and provisional application No. 60/310,299, filed on Aug. 6, 2001.

(51) Int. Cl.[7] ............................................. H03K 17/16
(52) U.S. Cl. ............................. 326/30; 326/86; 326/90
(58) Field of Search ............................. 326/30, 82, 83, 326/86, 90

(56) References Cited

U.S. PATENT DOCUMENTS 6,275,077 B1 * 8/2001 Tobin et al. ................. 327/108
6,380,758 B1 * 4/2002 Hsu et al. ...................... 326/30

* cited by examiner

Primary Examiner—Michael Tokar
Assistant Examiner—Anh Tran

(57) ABSTRACT

The present invention relates generally to the transmission of digital data. More particularly, the invention relates to a high-speed data transmission between integral circuits (ICs) or chips.

A data transmission means for high-speed transmission of digital data is proposed, the data transmission means comprising:
   at least one driver for driving a transmission line; and
   a timing deskewing means connected thereto, wherein the timing deskewing means comprises
      a storage means for recording and storing information on skew caused by inter-symbol interference and cross-talk influence in the transmission line, for at least one data pattern transmitted through the transmission line; and
      an adjustment means for generating and applying a correction to the timing position of a signal transition between two logical levels, the correction being generated on the basis of the information stored in the storage means, so as to compensate for the above skew.

The present invention allows to reduce the skew of signals at the end of a transmission line so as to compensate for the effects of cross-talk and various signal reflections, settling time influence, or other kind of inter-symbol interference like frequency dependent line resistance due to skin effect and provide thereby a high performance transmission means for high speed transmission of digital data.

20 Claims, 5 Drawing Sheets

TRANSMITTER CIRCUIT COMPRISING TIMING DESKEWING MEANS

BACKGROUND OF THE INVENTION

1. Field of the Invention

The present invention relates generally to the transmission of digital data. More particularly, the invention relates to a high-speed data transmission between integral circuits (ICs) or chips.

2. Description of Related Art

Over last years, operating speed of computer processors has increased dramatically, resulting in additional demands on speeds of transmission of digital data. This has lead to very high frequencies in data transmission lines. At high frequencies some effects occur not observed at low frequencies and connected with the behavior of receiving loads (wires, circuit boards and integrated-circuit packages that make up a digital product).

Small lengths of signal conductors such as shown in FIG. 3a, can act like analog transmission lines, producing reflections which may distort received signals as shown in FIGS. 4a–4c and produce effects such as ringing, bouncing, and overshoot. Such distortion, combined with other sources of noise, such as cross-talk between conductors as shown in FIG. 5b, may produce faulty operations in circuits which otherwise appear to have satisfactory design specifications. That is, at high frequencies load elements directly affect electrical performance. Accordingly, such transmission line effects, especially with respect to circuits having critical timing requirements for signal reception, are becoming the matter of increasing importance.

One high frequency effect of particular concern in the present invention is illustrated in FIG. 5a. When a period of alteration of a signal, i.e. data rate, approaches the settling time of a signal on the data line, inter-symbol interference (ISI) occurs depending on the history of previously transmitted bits. Inter-symbol interference refers to the timing and signal quality impact of the previous state of the data line on the current state.

Charge storage both in the transmitting devices and the state of the transmission line causes a delay in the signal and a change in the slew rate. For example, if a transmitter is driving a very high frequency signal that is 1, 0, 1, 0 then each cycle the driver and transmission line must change state—with very high frequency systems each of these signals will approximate a triangular wave. When the same system transmits 1, 1, 1, 0 then the level of the signal which is already a 1, will be higher than in the case where the state is inverting on every cycle.

Thus, as seen in FIG. 5a, a signal will reach different values depending on how long the present state of the signal is maintained, whereby the cross-point of the signal and the reference shifts, thus causing a skew. To eliminate the skew, a history of the signal shall be analysed and a clock adjusted accordingly.

Another high frequency effect of particular concern in the present invention as shown in FIGS. 4a–4c, is that of reflections which also cause ISI in the line. ISI is a function of the mismatch between the driver impedance, the transmission line impedance, and the transmission line length.

Moreover, a transmission line is generally not uniform. It can include unequal-impedance parts (as shown schematically by 32 and 33) such as conductive traces on different boards or in different layers of the same board, connectors, and/or cables. Interfaces between these parts will also produce reflections which will contribute in affecting the signal.

FIG. 3a illustrates a conventional communication link configuration with a driver 31 and a receiver 34 coupled to a transmission line comprising portions 32 and 33 of different impedance $Z_1$ and $Z_2$. Data that applied to an input terminal of the driver 31 appears at an output terminal of the driver 31, allowing a data signal, such as shown in FIG. 4a, to be transferred via the transmission line 32. If there is a significant impedance mismatch between the transmission lines 32 and 33, a reflection from the line discontinuity (on the border of portions 32 and 33) can occur, so that the signal actually transmitted will be as FIG. 4b, not as shown in FIG. 4a (where $t_1$ is a propagation time in the line portion having impedance $Z_1$). The presence of reflections in a transmission line can cause an increase in the skew and a corresponding decrease in the overall bus transfer rate. Thus, it would be beneficial to have a device adapted to handle these kind of reflections, to enhance thereby bus transfer rate.

This effect can occur also when the impedance of a transmission line does not match the impedance of a terminating load 35 on the driving or receiving end of the line. Ideally, a terminating load $R_2$ will sink a transmitted signal immediately upon the signal arriving at the load. However, the terminating load often does not match the transmission line impedance because of variations in output resistance which can result from the production variations of elements and/or variations in power supply voltage and/or temperature. In this case the load will sink only a portion of the signal upon the signal's initial arrival. The remaining portion of the signal will be reflected back onto the transmission line after a time $t_1+t_2$, so that the signal at the load 35 would be as shown in FIG. 4c (left part). If the receiving circuit provides a terminating load $R_2$ that matches the impedance $Z_2$ of the transmission line, the reflected signal portion will sink on reaching the receiving end 34. Otherwise, the reflected signal portion will be partially reflected again and thus return to the receiving end after a time $3t_1+t_2$ as shown in FIG. 4c (right part). Thus, substantial portions of the reflected signal can go back and forth until they damp in the transmission line. Each time the reflected signal portion comes to the receiving end it affects the main signal by producing an additional skew. This will reduce the precision with which the signal can be measured and therefore will not allow increasing the speed of data transmission.

Efforts were made to eliminate, or at least greatly reduce, signal reflections by matching, insofar as possible, the impedance of a terminating load 35 and that of a transmission line portions 32 and 33.

Known are various means for impedance matching disclosed in U.S. Pat. Nos. 4,719,369; 5,134,311; 5,162,672; 5,811,197; 5,602,494; 6,191,663; 6,175,250; 6,157,215; 6,130,563; 6,127,862; 6,118,310; 6,087,853; 6,060,907; 5,955,894.

Generally, these patents disclose IC output drivers comprising a circuit which compensates for the variations in output resistance.

With the driver according to U.S. Pat. No. 6,118,310, a portion of the signal reflected on the receiving end back onto the transmission line will sink on its driving end and thus not affect the received signal. However, this driver will not help in sinking the above-mentioned reflections produced at the interfaces between the unequal-impedance parts of the transmission line. These reflections can go back and forth between the receiver and respective interface, not reaching the driver end where they could be terminated.

Thus, even though impedance-matching means are used in the prior art, reflections and inter-symbol interference still exist and affect the signal by producing additional skew. Furthermore, topological restrictions and transmission line discontinuities can make impedance balancing impractical or very difficult (and therefore costly) to implement. Even more significantly, signal distortions associated with transmission line effects are due to both reflections and re-reflections of signals, and taking steps to suppress or reduce both type of reflections may be even more difficult, costly and less useful.

Known is a skew reducer described in U.S. Pat. No. 5,953,521, wherein, to compensate for the skew caused by an inter-symbol interference in a signal pattern transmitted, predetermined delays are applied to a data to be transmitted via a transmission line. However, this means can use only two predetermined delay values, while in practice, a multitude of delays may be required. Moreover, the delay values cannot be adjusted to actual transmission channel characteristics because they are fixed at a production stage. And the last, but not the least important issue is that the known means allows to compensate for inter-symbol interference only, not cross-talk effects. At the same time, the cross-talk from adjacent lines is still another actual problem of high-frequency data transmission. Say, if both signals move from 0 to 1 at the same time, the rising edges contain high frequency components that will be radiated from each line to the other and cause both signals to rise faster than if they were to switch in isolation. Conversely if one line moves from 0 to 1 and the other moves from 1 to 0, the signal slew rate will be lower than that where the lines change in isolation.

This effect will be discussed with reference to FIG. 3b and FIG. 5b.

In FIG. 3b, a two wires' configuration carrying a digital signal is shown. A signal, such as shown in FIG. 5b, is transmitted along a transmission line 1 driven by a driver 41, the transmission line 2 being quiet. Nevertheless, small signals will appear in the transmission line 2 due to cross-talk effect, as illustrated in FIG. 5c. Therefore, if a signal shown in FIG. 5d is to be transmitted along a transmission line 2, the actual shape of the signal would be as shown in FIG. 5e. It is evident that this situation would result in additional skew as shown in FIG. 5e.

This cross coupling is strongly pattern dependent: if an 8-bit bus for example has all signals moving from 0 to 1, the skew between signals at the receiver will be very different from where a hexadecimal AA pattern is transmitted. Moreover, the historical pattern dependency still remains and requires a line by line compensation based on the historical state of that line, for example, the last three bits transmitted.

Integrated circuit technology has continually advanced to produce increased device performance largely by shrinking the dimensions of the physical structures fabricated on semiconductor chips. For example, the trend today is to produce devices in signal lines having physical dimensions in the sub-micron range. As structures have been scaled down in size, factors such as noise and signal interference have become major problems. Basically, the close physical distance between adjacent signal lines leads to unintentional coupling and interference.

A variety of techniques have been used to reduce crosstalk between adjacent signal lines. In the field of random access memory arrays, shielded bit line architectures have been employed in which two pairs of opposed bit lines associated with a common sense amplifier have an adjacent unselected line pair that is clamped to AC ground to shield the selected line pair from dynamic coupling effects. This approach is described in U.S. Pat. No. 5,010,524. A similar approach is disclosed in U.S. Pat. No. 5,646,556, which teaches an apparatus for pre-charging pairs of bus conductors to alternating rails in order to minimize crosstalk and speed degradation problems. Another example of modifying the spacing and physical arrangement of the signal lines to prevent crosstalk is described in U.S. Pat. No. 5,475,643.

Other practitioners have approached the problem from a different perspective. For example, U.S. Pat. No. 5,596,506 teaches a method for predicting respective magnitudes of crosstalk voltages before the actual fabrication of an integrated circuit (I/C) chip. Following circuit simulation, the signal line layout of the chip is modified according to an algorithm, which includes changing driver circuits, moving signal lines, and inserting buffer circuits into the chip. U.S. Pat. No. 5,311,074 attempts a more radical approach to reducing crosstalk by reducing signal line voltages through a large scale cell array region of the chip. The signal voltages are restored back to their original logic levels upon exiting the cell array.

Thus, in a high performance digital bus, to obtain a good signal quality, it is important both to eliminate cross-talk effects in the transmission line, and also to reduce inter-symbol interference (ISI). Most often, as has been discussed above, it is impractical to match the driver impedance to the line impedance. Thus, an unfulfilled need exists for an apparatus and method capable of compensating for the intersymbol and crosstalk effects in coupled busses.

The object of the invention is to reduce the skew of signals at a receiver end (at the end of a transmission line) so as to compensate for the effects of cross-talk and various signal reflections, settling time influence, or other kind of inter-symbol interference (like frequency dependent line resistance due to skin effect).

BRIEF SUMMARY OF THE INVENTION

According to the invention, information on signal distortions caused by inter-symbol interference and by cross-talk in the whole transmission path is stored in a storage device and used for compensation for signal skew in these lines. By changing parameters of the driver as a function of the historical data pattern in the line and information on skew caused by inter-symbol interference, on one hand, and, of the current data pattern in all lines and information on skew caused by cross-talk in neighbouring lines, on the other hand, it is possible to compensate for the skew caused by both these reasons.

As a result, a system is proposed which can use the obtained summary information for dealing with various problems caused by different transmission line effects including cross-talk of neighboring lines, pattern effects, etc as mentioned above, and even those, the exact origin of which is unknown. The proposed system may comprise a look-up table containing data for compensating both cross-talk and inter-symbol interference effects. Alternatively, sub-systems for compensating for different effects may be independent. For example, the pattern dependency managing cross-talk may be independent of the system dealing with the historical pattern dependency.

The present invention provides a means to vary parameters of a signal as a function of the data pattern being transmitted by changing the driver strength or by adding or subtracting delay elements to the signal.

According to one aspect of the present invention, a data transmission means for high-speed transmission of digital data is proposed, the data transmission means comprising:

at least one driver for driving a transmission line and a timing deskewing means connected thereto, wherein the timing deskewing means comprises a storage means for recording and storing information on skew caused by inter-symbol interference and cross-talk influence in the transmission line, for at least one data pattern transmitted through the transmission line; and an adjustment means for generating and applying a correction to the timing position of a signal transition between two logical levels, the correction being generated on the basis of the information stored in the storage means, so as to compensate the above skew.

The combination of the above features enables to eliminate both the crosstalk influence and inter-symbol interference influence which result in a skew at the receiver and to enable transmission and reception of electronic communications orders of magnitude faster than is possible using prior art technique.

In another aspect of the invention, a method of eliminating skew caused by inter-symbol interference and cross-talk effects in transmission lines for high-speed transmission of digital data is proposed, the method comprising:

transmitting of digital data through the transmission line provided by at least one driver;

measuring a skew for at least one data pattern transmitted through the transmission line; and recording and storing information on skew caused by inter-symbol interference and cross-talk influence in the transmission line, for at least one data pattern transmitted through the transmission line; and generating and applying a correction to the timing position of a signal transition between two logical levels, the correction being generated on the basis of the information stored in the storage means, so as to compensate for the above skew.

In still another aspect of the invention, a transmission system for high-speed transmission of digital data is proposed, the transmission system including at least one transmission line electrically connecting a transmission means and a receiving means; wherein the transmission means is the transmission means in accordance with the present invention.

The driving circuit may comprise at least one driver, or a plurality of drivers.

Preferably, the storage means stores parameters on previous data patterns.

As an example, a driver with variable drive strength may be used, e.g. a plurality of drive transistors connected in parallel with the gates controlled to determine the number of transistors that are turned on.

In another example embodiment, a driver with a variable delay is used. The delay may be incorporated into the data signal line of the driver as shown in FIG. 1b. Alternatively, the delay may be incorporated into the clock line as shown in FIG. 1c.

BRIEF DESCRIPTION OF THE SEVERAL VIEWS OF THE DRAWINGS

FIGS. 4a–4c show timing diagrams illustrating the effect of inter-symbol interference caused by reflections in a transmission line; in which:

FIG. 4a shows a signal to be transmitted, FIG. 4b shows an actual signal at the driver end; and FIG. 4c shows a signal at the receiver end.

In FIG. 5b, a signal transmitted along one of the coupled transmission lines is shown;

in FIG. 5c, a signal induced on a neighboring quiet line due to crosstalk is shown (no transitions showed on the line for simplicity);

in FIG. 5d, a signal transmitted on a neighbouring line is shown (no crosstalk effect is shown for clarity of explanation); and in FIG. 5e, a signal resulting from the signal transmitted along this line and a signal induced in this line by the neighbouring line is shown.

DETAILED DESCRIPTION OF THE INVENTION

The present invention relates to a de-skewing means for compensating skew caused by inter-symbol interference and cross-talk influence in high speed communication systems. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiment shown and described, but is to be accorded the widest scope consistent with the principles and novel features herein disclosed.

Figure 1A:
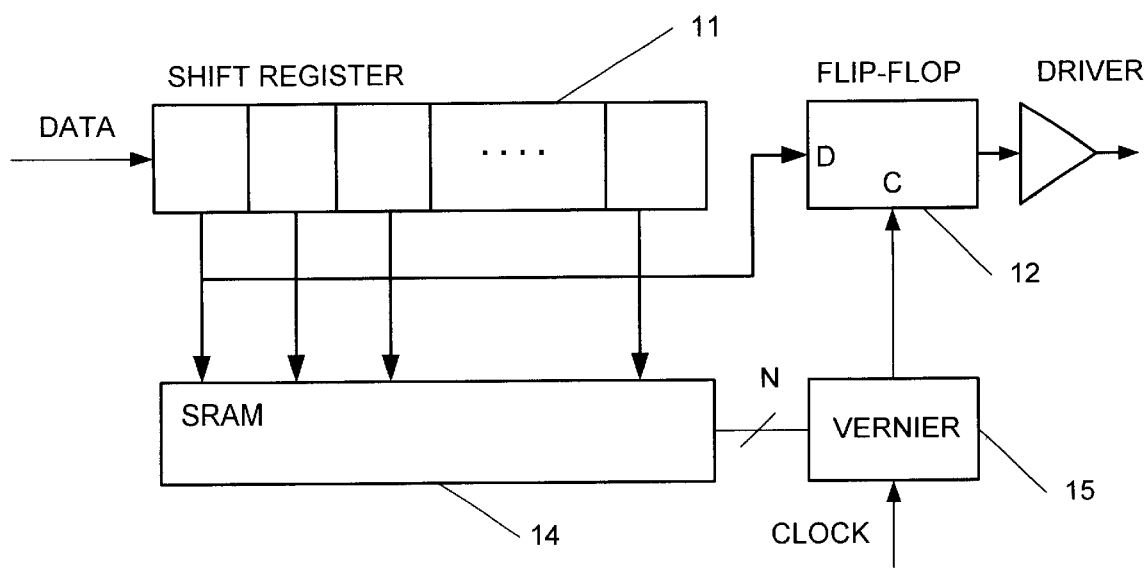
FIG. 1a is a schematic diagram showing a driving circuit with a deskewing means for compensating historical pattern dependency according to a first embodiment of the present invention.
Figure 1B:
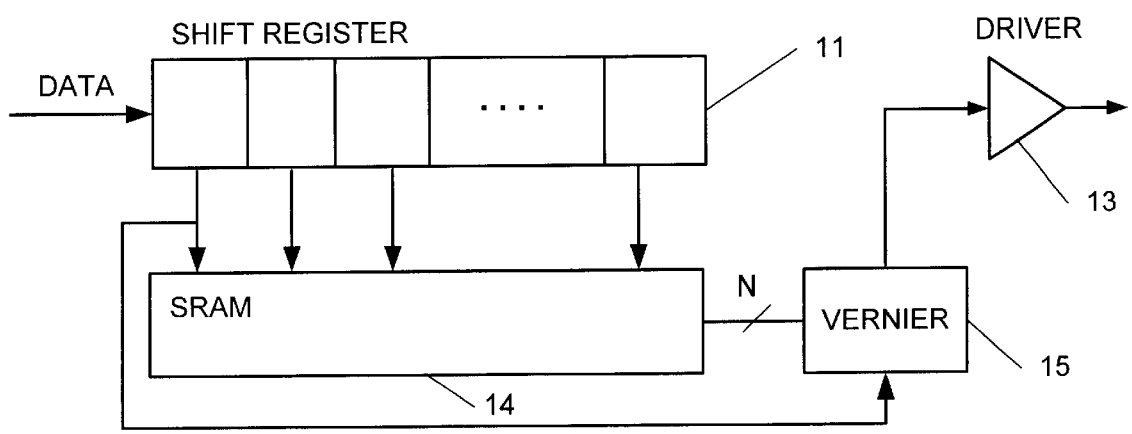
FIG. 1b is another example diagram of a driving circuit according to the first embodiment of the invention, comprising a variable delay incorporated into the signal line of the driver.
Figure 1C:
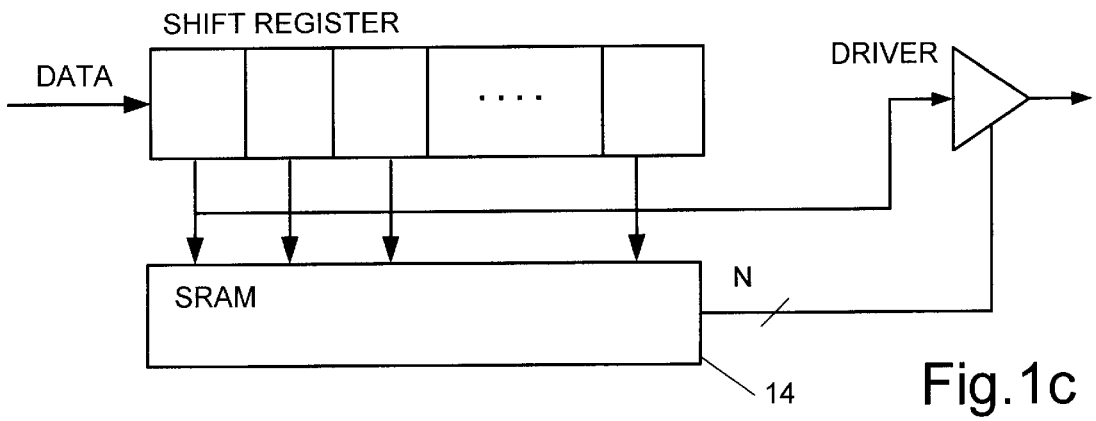
FIG. 1c is one more example diagram of a driving circuit wherein a deskewing means is incorporated into the clock line of the driver.

In FIG. 1 a driving circuit according to the first embodiment of the present invention is shown. The circuit comprises a driver 13 for driving a transmission line, a device for storing information transferred during a preselected period of time, which can be implemented as shift register 11, and a deskewing means. The deskewing means consists of flip-flop 12, the clock input of which is connected to the vernier device 15, wherein the data input of the flip-flop is supplied with the most recent data bit from the shift register 11. The vernier 15 is controlled by a control unit, which can be simply a look-up table implemented as SRAM 14. The look-up table is used to store the values or parameters relating to the previous signal patterns. The input data for the control unit are the data from shift register 11 containing information on the transferred data.

The circuit operates as follows. Assume the incoming signal is supplied to shift register 11. Depending on the historical data pattern in the data line, control unit 14 generates an appropriate code to the vernier 15. Vernier 15 delays input clock signal for flip-flop 12 according to this code, thereby flip-flop 12 clocks the current input data fed therein with a respective timing adjustment.

It shall be mentioned that, before operation starts, an information on the required adjustment shall be loaded to control unit 14. This information can be obtained either by simulation, measurements with scope, or preferably, by automatic calibration process. To obtain full information, all the possible variants of data pattern combinations shall be run during the calibration, e.g. for a 8-bit shift register, it will be $2^8=256$ possible combinations.

Figure 2A:
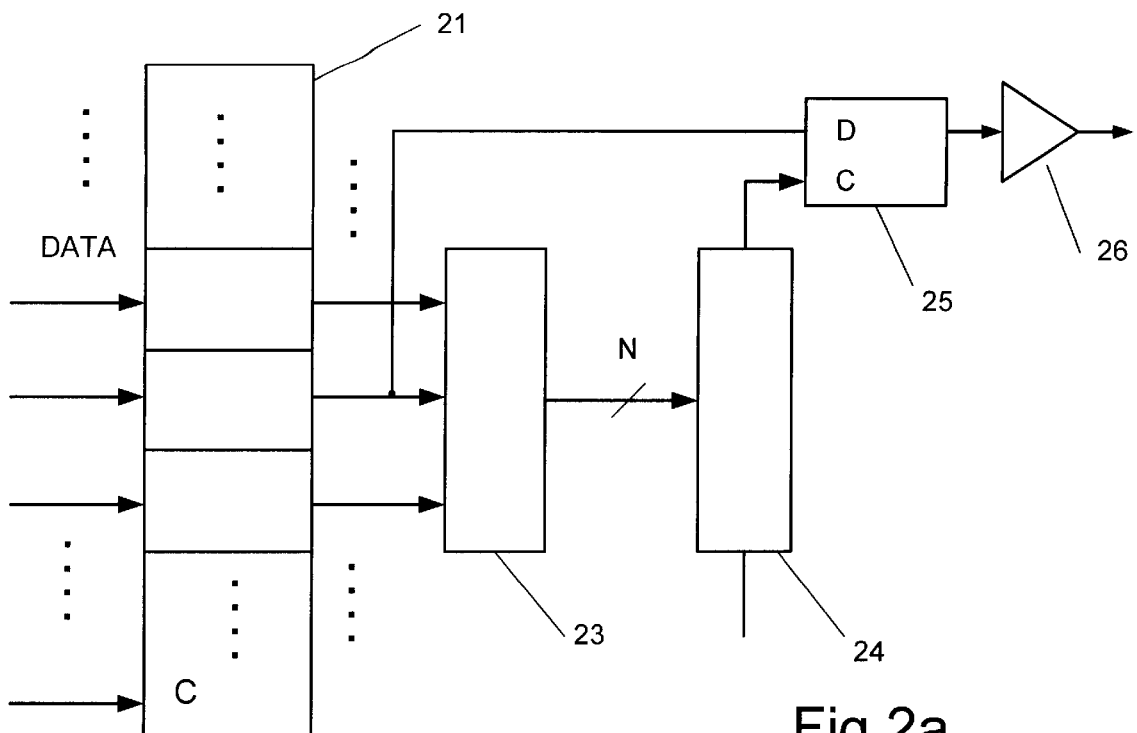
FIG. 2a is a schematic diagram showing a driving circuit comprising a deskewing means for compensating skew caused by cross-talk pattern dependency according to a second example embodiment of the present invention.
Figure 2B:
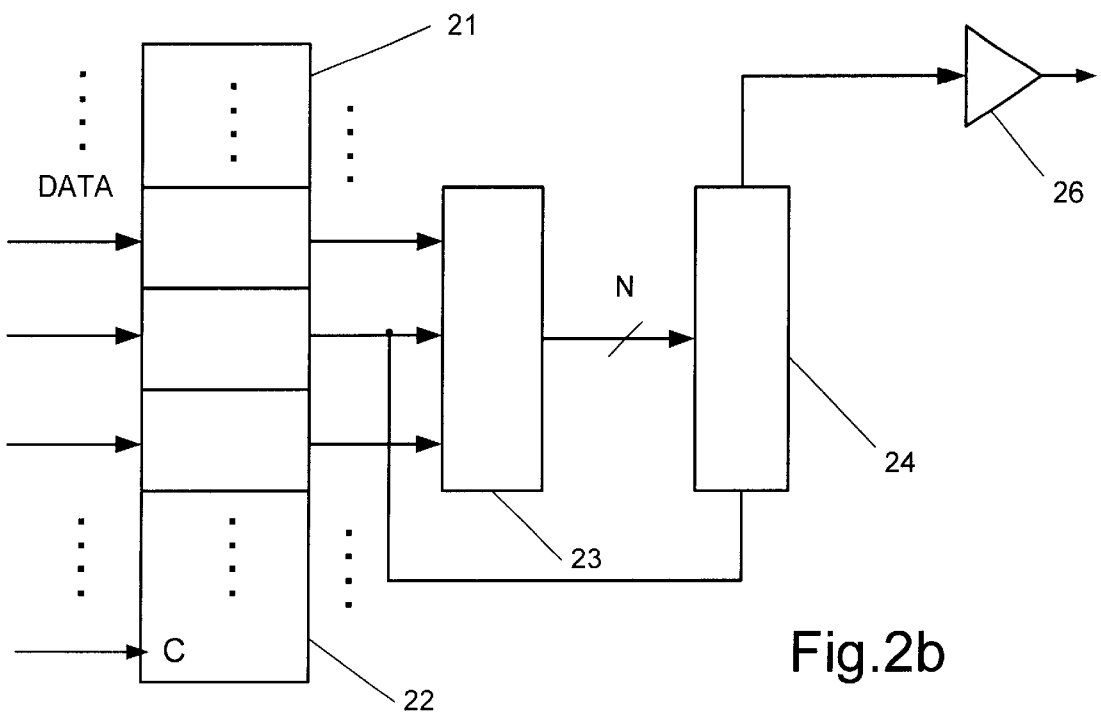
FIG. 2b is another example diagram of a driving circuit for compensating skew caused by cross-talk effects wherein an adjustment is applied into a clock line of a driver.
Figure 3A:
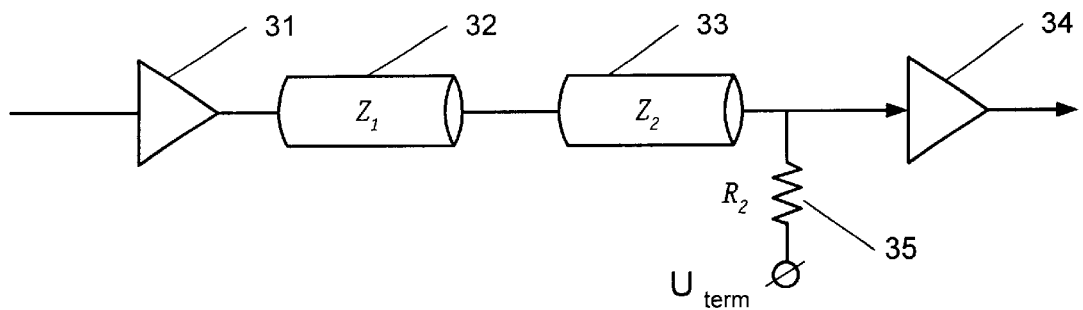
FIG. 3a shows a transmission line with discontinuities.
Figure 3B:
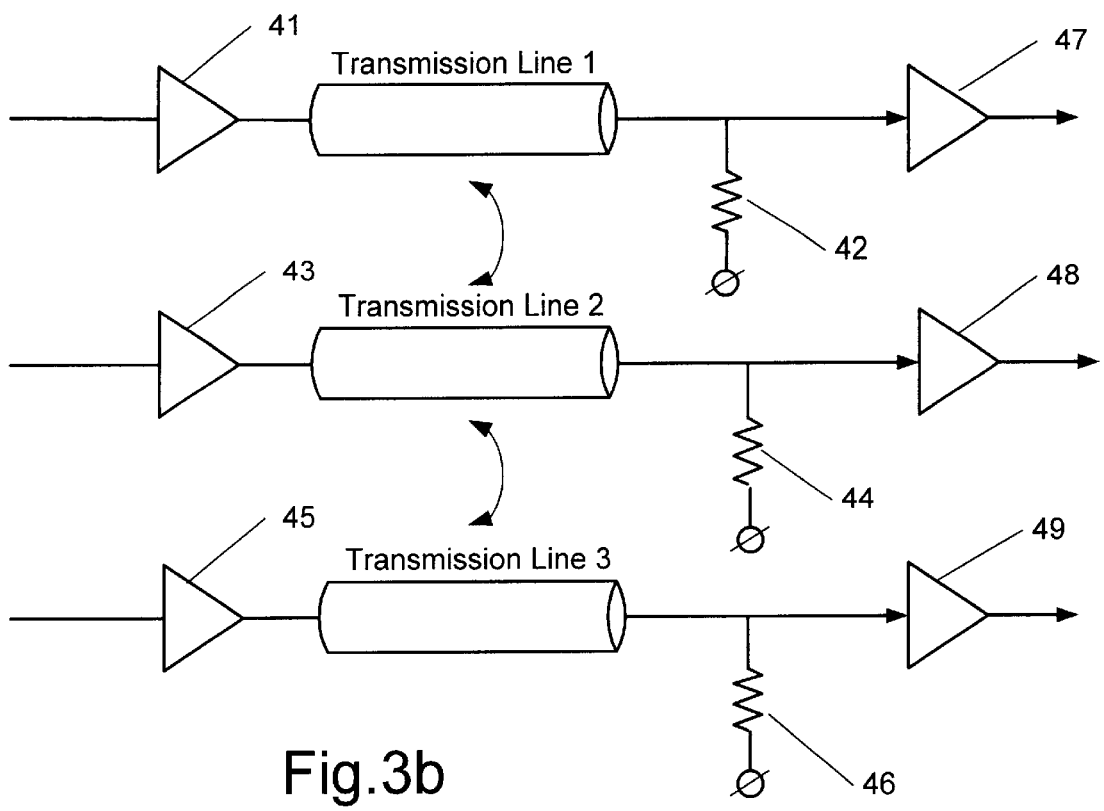
FIG. 3b shows coupled transmission lines in which crosstalk effects occur.
Figure 4A:
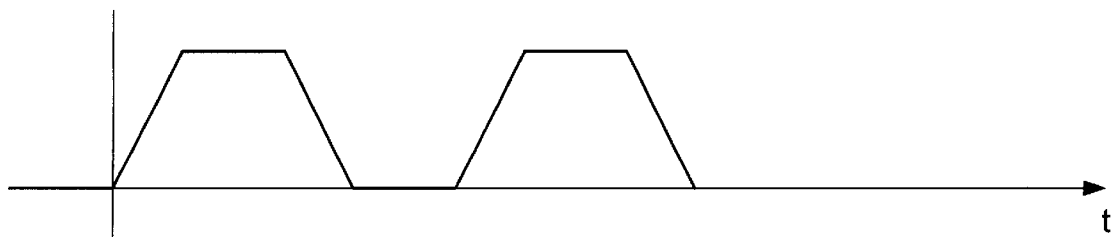
Figure 4B:
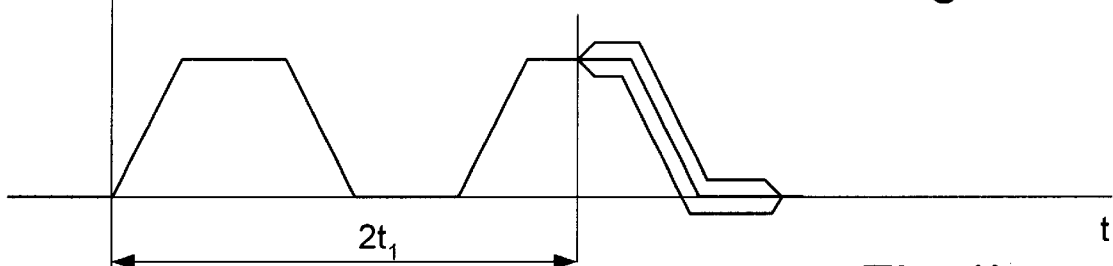
Figure 4C:
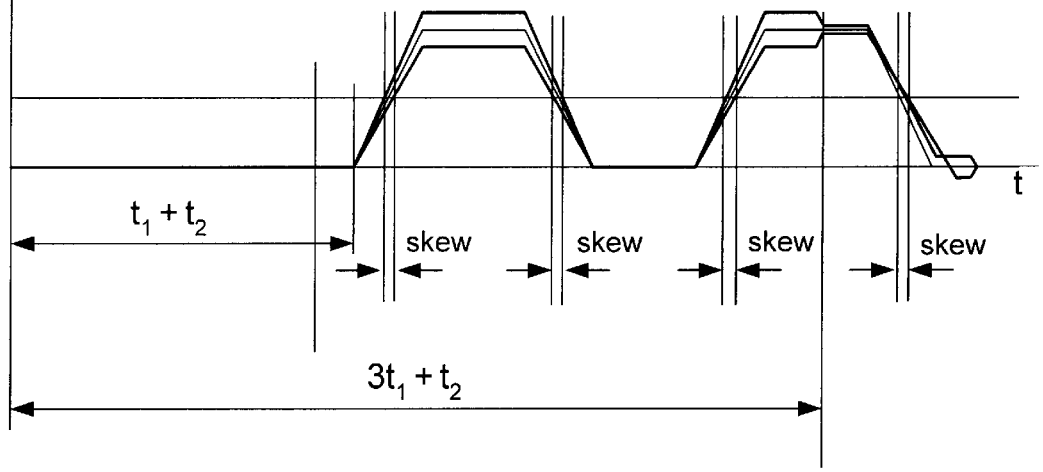
Figure 5A:
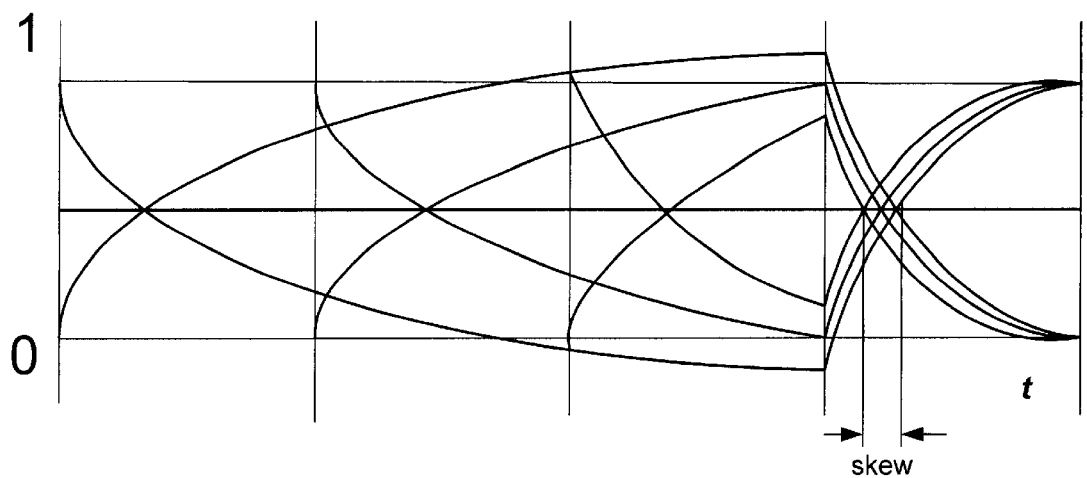
FIG. 5a is a timing diagram illustrating inter-symbol interference caused by settling time effect in a transmission line.
Figure 5B:
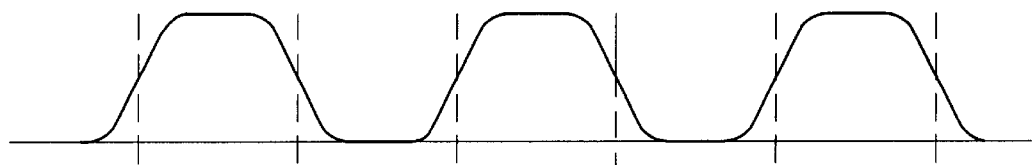
FIGS. 5b–5e show timing diagrams illustrating skew caused by crosstalk effects in coupled transmission lines.
Figure 5C:
Figure 5D:
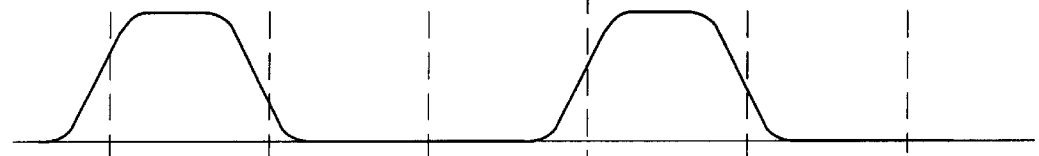
Figure 5E:
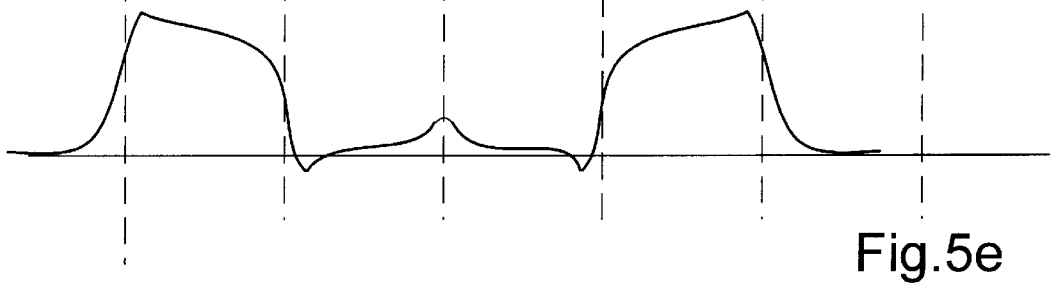

The second example embodiment of the present invention is shown in FIGS. 2a–2b. It shall be noted that, for the ease of explanation, only one transmission line with one driving circuit is shown in the figure, wherein, actually, a plurality of transmission lines can be operable in the same mode.

The example circuit of FIG. 2 comprises a driver 26 which drives a transmission line and a device 21 for storing information for all data lines, transferred at the current moment of time. In this embodiment, the device 21 is implemented as a parallel register.

A deskewing means consists of flip-flop 25, the clock input of which is connected to the vernier device 24, wherein the data input of the flip-flop is connected with one of the data lines from register 21. The vernier is controlled by a control unit 23, which can be simply a look-up table implemented as SRAM.

The input data for the control unit 23 is the data from the parallel register 21 containing information on the data being transferred at a certain moment of time.

The circuit operates as follows. Assume the incoming signal is supplied to parallel register 21. Depending on the contents of the parallel register containing information on the currently transferred data pattern, the control unit 23 generates appropriate code for vernier 24. The vernier delays input clock signal for the line according to this code. Thereby, flip-flop 25 clocks current input data fed to the flip-flop with a respective timing adjustment.

Before operation starts, an information on the required adjustment shall be loaded to the control unit 23. This information can be obtained either by simulation, measurements with scope, or preferably, by automatic calibration process. To obtain full information, all the possible variants of data pattern combinations shall be run during calibration, e.g. for a 8-bit parallel transmission, it will be a $2^8=256$ possible combinations.

One more possible application of the invention relating to chip-to-chip communications is that in many cases, a signal skew is exacerbated by poor driver design in the chip.

Among typical mistakes in high speed driver design, P-type devices being not matched carefully to the N-type devices is one of high importance, such that the rise time is very different to the fall time for each stage of a driver or buffer. Therefore, proper matching thoughout the whole driver and predrivers to take into account the differences in electron mobility between the P and N type devices is highly desirable.

Moreover, the idealised driver comprises a series of inverters, wherein the each subsequent inverter is bigger than the previous stage, as this enables the driver to work as fast as possible. In reality, buffer ratios between 3:1 and 16:1 are common. The path through each of these stages has a high to low transition and a low to high transition: that is the overall skew on the two edges will be the sum of two paths.

This variation in the differences in the rising and falling edge transition times can be equalised by application of the present invention, according to the respective rise and fall times.

It shall be also appreciated that various modifications can be made to the present invention without departing from the spirit and scope of the claims.

We claim:

1. A data transmission means for high-speed transmission of digital data, the data transmission means comprising:
   at least one driver for driving a transmission line and
   a timing deskewing means connected thereto, wherein the timing deskewing means comprises
   a storage means for recording and storing information on skew caused by inter-symbol interference and crosstalk influence in the transmission line, for at least one data pattern transmitted through the transmission line; and
   an adjustment means for generating and applying a correction to the timing position of a signal transition between two logical levels, the correction being generated on the basis of the information stored in the storage means, so as to compensate for the above skew.

2. The transmission means according to claim 1, wherein the storage means is adapted to record and store information on the skew caused by signal reflections in the transmission line.

3. The transmission means according to claim 1, wherein the storage means is adapted to record and store information on the skew caused by settling time effect in the transmission line.

4. The transmission means according to claim 1, comprising at least two transmission lines, wherein the storage means are further adapted to record and store information on the skew caused by signal crosstalk in said transmission lines, for at least one signal pattern transmitted through an adjacent transmission line.

5. The transmission means according to claim 1, wherein a shift register is used to address the storage means.

6. The transmission means according to claim 1, wherein a parallel register is used to address the storage means.

7. The transmission means according to claim 1, wherein the driver is a driver with variable drive current.

8. The transmission means according to claim 1, wherein a plurality of drivers is adjusted.

9. The transmission means according to claim 1, wherein the adjustment means comprises a variable delay incorporated into the data signal line.

10. The transmission means according to claim 1, wherein the adjustment means comprises a variable delay incorporated into the clock line which clocks output data.

11. A method of eliminating skew caused by inter-symbol interference and cross-talk influence in the transmission line for high-speed transmission of digital data, the method comprising:
    transmitting of digital data through the transmission line provided by at least one driver;
    measuring a skew for at least one data pattern transmitted through the transmission line; and
    recording and storing information on skew caused by inter-symbol interference and cross-talk influence in the transmission line, for at least one data pattern transmitted through the transmission line; and generating and applying a correction to the timing position of a signal transition between two logical levels, the correction being generated on the basis of the information stored in the storage means, so as to compensate for the above skew.

12. The method according to claim 11, wherein the information is recorded and stored on skew caused by signal reflections in the transmission line.

13. The method according to claim 11, wherein the information is recorded and stored on skew caused by settling time effect in the transmission line.

14. The method according to claim 11, wherein the information is recorded and stored on skew caused by signal crosstalk in said transmission line, of at least one signal pattern transmitted through an adjacent transmission line.

15. The method according to claim 11, wherein the correction is applied to the data signal line.

16. The method according to claim 11, wherein the correction is applied to the clock line, which clocks output data.

17. A transmission system for high-speed transmission of digital data, the transmission system including at least one transmission line electrically connecting a transmission means and a receiving means, wherein the transmission means comprises at least one driver for driving a transmission line and a timing deskewing means connected thereto, the timing deskewing means comprising:

a storage means for recording and storing information on skew caused by inter-symbol interference and crosstalk influence in the transmission line, for at least one data pattern transmitted through the transmission line; and an adjustment means for generating and applying a correction to the timing position of a signal transition between two logical levels, the correction being generated on the basis of the information stored in the storage means, so as to compensate for the above skew.

18. The transmission means according to claim 17, wherein the storage. means is adapted to record and store information on the skew caused by signal reflections in the transmission line.

19. The transmission means according to claim 17, wherein the storage means is adapted to record and store information on the skew caused by settling time effect in the transmission line.

20. The transmission means according to claim 17, comprising at least two transmission lines, wherein the storage means are further adapted to record and store information on the skew caused by signal crosstalk in said transmission lines, for at least one signal pattern transmitted through an adjacent transmission line.

* * * * *